United States Patent
Okushima et al.

(10) Patent No.: US 8,828,307 B2
(45) Date of Patent: Sep. 9, 2014

(54) IMPRINT METHOD, CHIP PRODUCTION PROCESS, AND IMPRINT APPARATUS

(75) Inventors: Shingo Okushima, Tokyo (JP); Junichi Seki, Yokohama (JP); Atsunori Terasaki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/091,836

(22) PCT Filed: Mar. 17, 2008

(86) PCT No.: PCT/JP2008/055354
§ 371 (c)(1),
(2), (4) Date: Apr. 28, 2008

(87) PCT Pub. No.: WO2008/114881
PCT Pub. Date: Sep. 25, 2008

(65) Prior Publication Data
US 2009/0098688 A1   Apr. 16, 2009

(30) Foreign Application Priority Data

Mar. 16, 2007   (JP) .................................. 2007-068628

(51) Int. Cl.
| | |
|---|---|
| *B29C 35/08* | (2006.01) |
| *B82Y 40/00* | (2011.01) |
| *B29C 37/00* | (2006.01) |
| *B29C 43/00* | (2006.01) |
| *B29C 43/02* | (2006.01) |
| *B82Y 10/00* | (2011.01) |
| *G03F 7/00* | (2006.01) |
| *B28B 11/24* | (2006.01) |
| *H01J 37/02* | (2006.01) |
| *B29C 43/58* | (2006.01) |
| *B29C 43/36* | (2006.01) |

(52) U.S. Cl.
CPC ..... *B29C 35/0888* (2013.01); *H01J 2237/0047* (2013.01); *H01J 2237/0042* (2013.01); *H01J 37/026* (2013.01); *B29C 37/0053* (2013.01); *B29C 43/003* (2013.01); *B29C 43/021* (2013.01); *B29C 43/58* (2013.01); *B29C 2035/0827* (2013.01); *B29C 2043/025* (2013.01); *B29C 2043/3634* (2013.01); *B29C 2043/5833* (2013.01); *B82Y 10/00* (2013.01); *B82Y 40/00* (2013.01); *G03F 7/0002* (2013.01)
USPC ......... 264/488; 264/494; 264/496; 430/125.1

(58) Field of Classification Search
CPC ................ B29C 35/0888; H01J 37/026; H01J 2237/0042; H01J 2237/0047
USPC ........ 977/887; 264/488, 494, 496; 425/174.4; 250/492.2; 430/125.1
See application file for complete search history.

(56) References Cited

U.S. PATENT DOCUMENTS

| | | | | |
|---|---|---|---|---|
| 4,534,921 | A * | 8/1985 | Fierkens et al. | 264/39 |
| 5,590,168 | A * | 12/1996 | Iketaki | 378/43 |
| 6,465,795 | B1 * | 10/2002 | Madonado et al. | 250/492.2 |
| 6,504,702 | B1 * | 1/2003 | Noll | 361/229 |
| 7,041,989 | B1 * | 5/2006 | Neerhof et al. | 250/492.2 |
| 7,068,055 | B2 * | 6/2006 | Hiroki | 324/750 |
| 7,871,744 | B2 | 1/2011 | Inao et al. | |
| 2003/0127007 | A1 * | 7/2003 | Sakurai et al. | 101/483 |
| 2005/0100830 | A1 * | 5/2005 | Xu et al. | 430/322 |
| 2006/0081557 | A1 * | 4/2006 | Xu et al. | 216/48 |
| 2006/0214318 | A1 | 9/2006 | Kaneko et al. | |
| 2006/0249886 | A1 * | 11/2006 | Chao et al. | 264/496 |

FOREIGN PATENT DOCUMENTS

| | | | |
|---|---|---|---|
| JP | 1-101128 A | | 4/1989 |
| JP | 7-45397 | | 2/1995 |
| JP | 10269636 A | * | 10/1998 |
| JP | 2000-218659 | | 8/2000 |
| JP | 2000218659 A | * | 8/2000 |
| JP | 2000321777 A | * | 11/2000 |
| JP | 2006-088457 A | | 4/2006 |
| JP | 2006-269000 | | 10/2006 |
| JP | 2007-073939 | | 3/2007 |
| JP | 2007098779 A | * | 4/2007 |
| KR | 10-0674157 B1 | | 1/2007 |

OTHER PUBLICATIONS

JP 2000218659 A Machine Translation.*
JP 2000218659 A Abstract Translation.*
Stephen Y. Chou, et al., "Imprint of Sub-25 nm Vias and Trenches in Polymers", Appl. Phys. Lett. 67 (21), Nov. 1995, pp. 3114-3116.
Written Opinion of the International Searching Authority mailed Jul. 18, 2008, issued in corresponding International Application No. PCT/JP2008/055354.
International Search Report dated Jul. 11, 2008, which issued in corresponding International Application No. PCT/JP2008/055354.
Korean Official Action dated Jun. 1, 2011, issued in corresponding Korean patent application No. 10-2009-7021307, with a Japanese translation.
English translation of Korean Office Action dated Jun. 1, 2011, issued in corresponding Korean patent application No. 10-2009-7021307.
English translation of Korean Notice of Allowance dated Nov. 30, 2011, issued in corresponding Korean Patent Application No. 10-2009-7021307.
Notice of Allowance issued by the Korean Patent Office on Nov. 30, 2011, in counterpart Korean patent application No. 10-2009-7021307.
Japanese Office Action dated Jul. 31, 2012, issued in counterpart Japanese Patent Application No. 2008-064858, which excerpted English translation.

* cited by examiner

*Primary Examiner* — Atul P. Khare
(74) *Attorney, Agent, or Firm* — Fitzpatrick, Cella, Harper & Scinto

(57) ABSTRACT

An imprint method includes contacting an imprint pattern of a mold and a resin material on a substrate. The resin material is cured by irradiating the resin material with light in a state in which the imprint pattern is in contact with the resin material. The mold is parted from the cured resin material, and gaseous molecules are irradiated, in an atmosphere in which the mold is placed, with an electromagnetic wave having a wavelength that is shorter than a wavelength of the light irradiating the resin material. The electromagnetic wave is emitted from an electrification removing light source that is provided in a lateral side of the mold. In the irradiating step, the gaseous molecules are ionized by the irradiation of the electromagnetic wave from the electrification removing light source. The ionized gaseous molecules are supplied into an atmosphere between the substrate and the mold to remove electrification of at least a portion of the mold.

18 Claims, 2 Drawing Sheets

IMPRINT METHOD, CHIP PRODUCTION PROCESS, AND IMPRINT APPARATUS

This application claims the benefit of Japanese Patent Application No. 2007-068628, filed on Mar. 16, 2007, which is hereby incorporated by reference herein in its entirety.

TECHNICAL FIELD

The present invention relates to an imprint method and an imprint apparatus.

BACKGROUND ART

In recent years, fine processing technology for transferring a fine structure provided at a surface of a mold onto a member to be processed, such as a resin material, a metallic material, or the like, has been developed and has received attention. (Appl. Phys. Lett., Vol. 67, Issue 21, pages 3114-3316 (1995) by Stephan Y. Chou, et al.) This technology is called nanoimprint (or nanoembossing), and provides a processing resolving power on the order of several nanometers. For this reason, the technology is expected to be applied to a next-generation semiconductor manufacturing technology in place of a light exposure device, such as a stepper, a scanner, or the like. Further, the technology is capable of effecting simultaneous processing during formation of a three-dimensional structure on a wafer. For this reason, the technology is expected to be applied to a wide variety of fields, such as manufacturing technologies, and the like, for optical devices, such as photonic crystals, and the like, biochips, such as μ-TAS (micro total analysis system), etc.

In such a pattern transfer technique using monoimprint, when it is used in the semiconductor manufacturing technology, a fine structure on a mold is transferred onto a work (workpiece) in the following manner.

First, on a substrate (e.g., a semiconductor wafer), as a member to be processed, constituting the work, a layer of a photocurable resin material is formed.

Next, a mold provided with a fine structure of a desired imprint pattern is aligned with the work, and an ultraviolet-curable resin material is filled between the mold and the substrate. Thereafter, the resin material is irradiated with ultraviolet rays, to be cured, followed by separating of the mold from the resin material.

As a result, the fine structure of the mold is transferred onto the resin material layer. By effecting etching, or the like, through the resin material layer as a mask, a pattern corresponding to the fine structure of the mold is formed on the substrate.

Incidentally, in a step of separating the mold (template) from the member to be processed (work and resin material) in the nanoimprint, electrification (separation charging) can occur at the surfaces of the mold and the work. Due to this charging, when the mold and the material are parted (separated) from each other, a discharge breakdown of the transferred pattern or adsorption of dust on or contamination of the mold can be caused to occur, resulting in a defective transferred pattern.

DISCLOSURE OF THE INVENTION

In view of the above-described problem, a principal object of the present invention is to provide an imprint method capable of alleviating an occurrence of a defect of a transferred pattern caused by a discharge breakdown of the transferred pattern, or adsorption of dust on or contamination of a mold during parting or separation between the mold and a work.

Another object of the present invention is to provide a chip production process and an imprint apparatus using the imprint method.

Herein, light includes an electromagnetic wave of 200 nm or less.

According to an aspect of the present invention, an imprint method comprises:

curing a resin material formed on a substrate in a state in which an imprint pattern of a mold is in contact with or in proximity with the resin material; and separating the mold from the cured resin material, wherein the parting is effected while irradiating an entire area in which the imprint pattern of the mold is formed, and the cured resin material with an electromagnetic wave for ionizing gaseous molecules in an atmosphere in which the mold and the cured resin material are placed.

According to another aspect of the present invention, a chip production process comprises:

preparing a member, including a substrate and a resin material cured on the substrate, obtained by using the imprinting method; and processing the substrate with the resin material as a mask.

According to a further aspect of the present invention, an imprint apparatus for effecting imprint onto a resin material on a substrate, comprises:

a mold holding portion for holding a mold having a pattern forming surface at which an imprint pattern is formed;

a substrate holding portion for holding the substrate; and an electromagnetic wave generation source for ionizing gaseous molecules in an atmosphere in which the mold held by the mold holding portion is placed, wherein the electromagnetic wave generation source is disposed so that the mold is irradiated with an electromagnetic wave generated from the electromagnetic wave, so that the electromagnetic wave travels from a surface, of the mold opposite from the pattern forming surface, toward the pattern forming surface.

The present invention provides an imprint method for imprinting a pattern of a mold onto a resin material on a substrate, the method comprising:

a contact step of bringing a pattern forming surface of the mold for transferring a pattern of the mold into contact with the resin material on the substrate;

a resin material curing step of curing the resin material; and a parting step of parting the mold from the resin material while performing electrification removal (electrical discharge) for removing electrification caused during a parting operation when the mold is parted from the resin material, which is cured in the resin material curing step. In the parting step, the electrification removal may be performed by irradiating a contact surface between the resin material and the pattern forming surface with light from an electrification removing light source, so as to pass the light through the mold or the substrate and the resin material on the substrate, thereby to ionize gaseous molecules in an ambient atmosphere. The light from the electrification removing light source may have a wavelength in a range of 100 nm or more and 200 nm or less. The electrification removal in the parting step may be performed in a low oxygen gas atmosphere. The electrification removal may also be performed in a reduced-pressure atmosphere. In the imprint method, the electrification removal in the parting step may be performed in the low oxygen gas atmosphere after the contact between the mold and the resin material in the contact step is performed in the reduced-pressure atmosphere. In the resin material curing step, a photocurable resin material may be used as the resin material, and is irradiated with light from a light source for photocuring to be cured. The irradiation with the light from the light source for photocuring and the irradiation with the light from the light source for electrification removal may be performed by using the same irradiation mechanism. The light source for photocuring and the light source for electrification removal may be constituted by the same light source, having both a wavelength for curing the photocurable resin material and a wavelength for removing electrification.

The present invention provides an imprint method for imprinting a pattern of a mold onto a resin material on a substrate, the method comprising:

preparing the substrate on which the resin material is disposed;

bringing the resin material and an imprint pattern surface of the mold into contact with each other;

curing the resin material by irradiating the resin material with light; and parting (separating) the mold from the resin material while removing electrification by introducing a gas into an atmosphere.

The present invention provides an imprint apparatus, for imprinting a pattern of a mold onto a resin material on a substrate by bringing a pattern forming surface of the mold into contact with the resin material, curing the resin material, and parting the mold from the resin material, comprising:

electrification removing means for removing electrification generated during the parting of the mold from the resin material, wherein the electrification removing means is constituted so that gaseous molecules in an atmosphere are ionizable by irradiating a contact surface between the resin material and the pattern forming surface of the mold with light from a light source for removing electrification. The light from the light source for electrification removal may have a wavelength in a range of 100 nm or more and 200 nm or less. The imprint apparatus may employ a photocurable resin material as the resin material and may further include a light source for photocuring as a means for irradiating the resin material with light for curing the resin material. The irradiation with the light from the light source for photocuring and the irradiation with the light from the light source for electrification removal may be performed using the same irradiation mechanism. The light source for photocuring and the light source for electrification removal may be constituted by the same light source, having both a wavelength for curing the photocurable resin material and a wavelength for removing electrification.

These and other objects, features and advantages of the present invention will become more apparent upon a consideration of the following description of the preferred embodiments of the present invention taken in conjunction with the accompanying drawings.

BEST MODE FOR CARRYING OUT THE INVENTION

Figure 1:
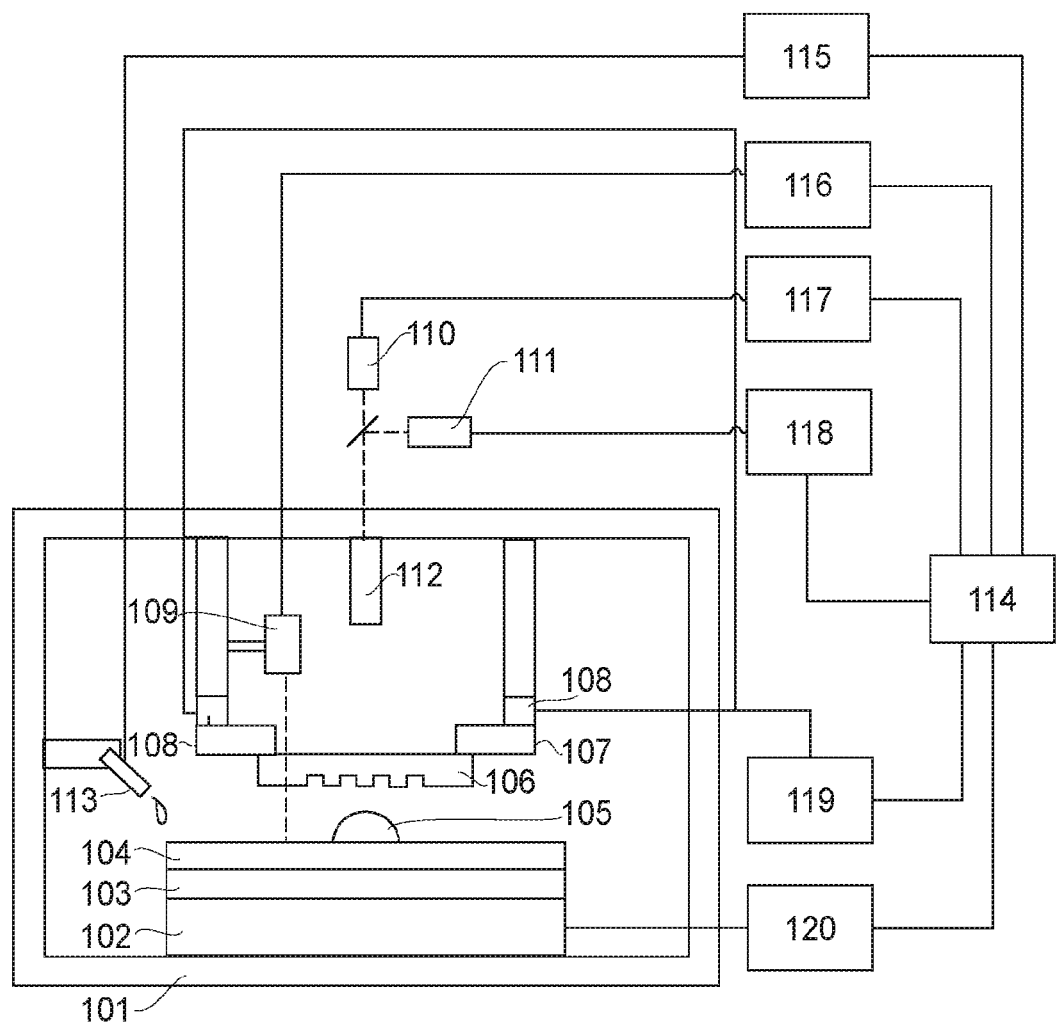
FIG. 1 is a schematic view for illustrating an embodiment according to an imprint apparatus of the present invention.
Figure 1:
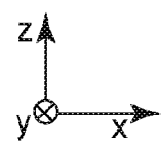

Embodiments for carrying out the imprint method and the imprint apparatus according to the present invention will now be described.

First Embodiment

Imprint Method

An imprint method in this embodiment will be described.

First, a resin material is cured in a state in which an imprint pattern of a mold is in contact with or in proximity with the resin material on a substrate. This state is realized by bringing an uncured resin material and the imprint pattern into direct contact or in proximity with each other. The proximity state means a state of indirect contact through, e.g., a parting layer (of a fluorine-containing silane coupling agent, or the like). The imprint pattern can also be said to be a pattern forming surface (imprint pattern surface). The mold will be specifically described later. As the resin material, it is possible to use a photocurable resin material, a thermoplastic resin material, and a thermosetting resin material. With respect to the curing of the resin material, the resin material is not necessarily completely cured.

Next, the mold is parted (separated) from the cured resin material. Irradiation of an electromagnetic wave for ionizing gaseous molecules in an atmosphere in which the mold and the cured resin material are placed is performed. The parting is effected while irradiating an entire area in which the imprint pattern of the mold is formed and the cured resin material with the electromagnetic wave.

During the parting, electrification can occur at the surface of the resin material and the mold. The electrification can be removed by performing the parting, while irradiating the entire area and the resin material with the electromagnetic wave. By irradiating the entire area with the electromagnetic wave, it is possible to remove the electrification, even when the electrification occurs at any portion of the resin material and the mold.

As described above, it is possible to perform the above-described parting, while removing the electrification, by irradiating the area of the mold and the cured resin material with the electromagnetic wave.

Irradiation Method of an Electromagnetic Wave

The irradiation of the cured resin material with the electromagnetic wave may preferably be performed through the mold. The irradiation may also be performed through the substrate, or from a lateral side with respect to the surfaces of the substrate and the mold. By transmission of the electromagnetic wave through the mold, the removal of electrification can be suitably performed irrespective of a material for the substrate. The irradiation of the electromagnetic wave may also be performed in methods other than the method of irradiating the resin material with the electromagnetic wave through the mold.

Wavelength of Electromagnetic Wave

The wavelength of the electromagnetic wave may preferably be selected from a range of 100 nm or more, and less than 200 nm. The electromagnetic wave may preferably be X-rays, and may preferably have a wavelength of 0.1 nm or less. The electromagnetic wave may also have a wavelength in other ranges, as long as they contains the above-described ranges.

Atmospheric State

After the resin material on the substrate is cured, it is preferable that inert gas for the above-described ionization be introduced into an atmosphere in which the mold and the cured resin material are placed. After the resin material on the substrate is cured, it is preferable that a pressure in the atmosphere in which the mold and the resin material are placed is 0.1 Pa or more, and 100 Pa or less.

The irradiation light for curing the resin material may preferably have a wavelength different from a wavelength of the electromagnetic wave for ionizing the gaseous molecules in the atmosphere.

It is preferable that removal of the electrification be performed by introducing inert gas into the atmosphere, in which the mold and the resin material are placed, after the contact between the resin material and the pattern forming surface, at which the imprint pattern is formed, is performed at a pressure of 0.1 Pa or more and 100 Pa or less in the atmosphere.

Second Embodiment

Chip Production Process

A chip production process in this embodiment will be described.

First, a member, including a substrate and a cured resin material layer disposed on the substrate obtained by using the imprint method described in the First Embodiment, is prepared. Thereafter, the substrate is processed by using the cured resin material as a mask. The thus processed substrate can be utilized as a semiconductor chip or a biochip. In the case in which the cured resin material remains as a residual film, the residual film can be removed. The processing can be performed by etching or ion implantation.

Third Embodiment

Imprint Apparatus

An imprint apparatus in this embodiment will be described.

The imprint apparatus is an apparatus for imprinting a pattern onto a resin material on a substrate.

This apparatus includes a mold holding portion for holding a mold having a pattern forming surface at which an imprint pattern is formed, a substrate holding portion for holding the substrate, and an electromagnetic wave generation source for ionizing gaseous molecules in an atmosphere in which the mold held by the mold holding portion is placed. The electromagnetic wave generation source is disposed so that the mold is irradiated with an electromagnetic wave generated from the electromagnetic wave generation source, so that the electromagnetic wave travels from a surface, of the mold opposite from the pattern forming surface, toward the pattern forming surface.

Electromagnetic Wave Generation Source

The electromagnetic wave generation source may preferably be used for removing electrification generated on the mold and the resin material.

The electromagnetic wave generated from the electromagnetic wave generation source may preferably have a wavelength selected from a range of 100 nm or more, and less than 200 nm.

Examples of the electromagnetic wave generation source may include an excimer lamp of argon (wavelength in a range with 126 nm as a center), an excimer lamp of argon fluoride (wavelength in a range with 193 nm as a center), an excimer lamp of xenon (wavelength in a range with 172 nm as a center), and a deuterium lamp capable of irradiation with an electromagnetic wave with a wide-range wavelength. However, in the present invention, the electromagnetic wave generation source is not limited thereto.

Light for Curing Resin Material and Means Therefor

The imprint apparatus may preferably be further provided with a resin material curing light source for curing the resin material on the substrate. Examples of the resin material curing light source may include a high-pressure mercury lamp capable of irradiation with an electromagnetic wave having a wavelength of about 365 nm. It is preferable that the mold is irradiated with the light from the resin material curing light source and the electromagnetic wave from the electromagnetic wave generation source, by using an irradiation mechanism common to the light and the electromagnetic wave.

In the imprint apparatus, the resin material may preferably be a photocurable resin material, and a light source for photocuring may preferably be used as an irradiation means for curing the resin material. Further, it is preferable that irradiation with the light from the light source for photocuring and the light generated from the electromagnetic wave generation source be performed through the same irradiation mechanism. Further, the light emitted from the irradiation mechanism may preferably have both a wavelength used for curing the photocurable resin material and a wavelength used for removing the above-described electrification.

A specific constitutional embodiment of the imprint apparatus will be described. FIG. 1 is a constitutional embodiment of such an imprint apparatus. In order to transfer a pattern of a mold used in this embodiment, a resin material is cured by bringing a pattern forming surface of the mold into contact with the resin material, and then, the mold is parted from the resin material.

Referring to FIG. 1, the imprint apparatus includes a casing 101, a stage 102, a substrate holding portion 103, a substrate 104, a photocurable resin material 105, a mold 106, a mold holding portion 107, a load cell 108, a scope 109, and a light source 110 for photocuring, a light source 111 for electrification removal, a light irradiation mechanism 112, a dispenser 113, a process control circuit 114, an application control circuit 115, a position detection circuit 116, an exposure amount control circuit 117, an electrification removal control circuit 118, a pressure detection circuit 119, and a position control circuit 120.

In the imprint apparatus of this embodiment, the mold 106 and the substrate 104 are disposed opposite to each other.

The mold 106 is a transparent member having a desired imprint pattern at its surface facing the substrate 104, and is connected to the casing 101 through the mold holding portion 107, the load cell 108, and a member. A material for the mold 106 can be appropriately selected from transparent materials capable of transmitting light having a wavelength of 200 nm or less, such as quartz, sapphire, fluorite, magnesium fluoride, lithium fluoride, and the like.

Specifically, light with a wavelength of about 150 nm or more is transmissible when quartz or sapphire is used, light with a wavelength of about 130 nm or more is transmissible when fluorite is used, light with a wavelength of about 115 nm or more is transmissible when magnesium fluoride is used, and light with a wavelength of about 100 nm or more is transmissible when lithium fluoride is used. Further, it is also possible to use two or more species of materials for the mold 106.

When the mold 106 is prepared by processing an $SiO_2$ thin film formed on a magnesium fluoride substrate to form a desired imprint pattern, the mold 106 is excellent in its ability to process, and transmissive to light having a short wavelength (115 nm or more and 150 nm or less, in this case). At the substrate 104-side surface of the mold 106, a releasing treatment using a fluorine-containing silane coupling agent, or the like, may generally be performed.

As a portion of the casing 101 opposite from a pattern transfer surface of the mold 106, the light irradiation mechanism 112 is provided. Light from the light source 110 for photocuring, constituting a means for curing the photocurable resin material and light form the light source 111 for electrification removal, constituting an electrification removing means, are emitted from the light irradiation mechanism 112. The light source 110 for photocuring emits light with a wavelength for curing the photocurable resin material 105. The light source 111 for electrification removal emits light for removing electrification of the mold 106, the photocurable resin material 105, and the substrate 104.

The scope 109 is constituted by a light source, a lens system and a CCD camera, and obtains positional information between the mold 106 and the substrate 104.

The substrate 104 is mounted on the stage 102 through the substrate holding portion 103.

The stage 102 has six movable directions with respect to six axes (x, y, z, θ, α, β), and is secured to the casing 101.

The dispenser 113 is attached to the casing 101 through a member, so that the photocurable resin material 105 can be applied onto the substrate at any position.

The photocurable resin material 105 is a resin material capable of being cured by irradiation thereof with light of a specific wavelength. As the photocurable resin material 105, it is possible to use a resin material (for example, "PAK-01", mfd. by Toyo Gosei Co., Ltd.). This photocurable resin material can be cured by using a high-pressure mercury lamp having a wavelength of about 365 nm.

The process control circuit 114 provides instructions to the application control circuit 115, the position detection circuit 116, the exposure amount control circuit 117, the electrification removal control circuit 118, the pressure detection circuit 119, and the position control circuit 120, to carry out the imprint process and to receive output data from these circuits.

The application control circuit 115 controls the dispenser 113, so as to apply the photocurable resin material 105 onto the substrate 104.

The position detection circuit 116 performs image processing of the image obtained by the scope 109 to determine a positional relationship between the mold 106 and the substrate 104.

The exposure amount control circuit 117 controls the light source 110 for photocuring to perform light exposure.

The electrification removal control circuit 118 controls the light source 111 for electrification removal, to remove electrification from the photocurable resin material 105, the mold 106, and the substrate 104.

The pressure detection circuit 119 calculates a pressure exerted between the mold 106 and the substrate 104 from a detection signal by the load cell 108 and an area of a portion to be processed.

The position control circuit 120 controls the stage 102, so that the mold 106 and the substrate 104 can satisfy a desired positional relationship.

Incidentally, arrangements and methods of the respective mechanisms are not limited to those in this embodiment, but may also be applicable to other constitutions. It is possible to employ such a constitution that the electrification removal light source 111 is disposed on a side opposite from the pattern transfer surface of the substrate 104, so that the pattern transfer surface is irradiated with light form the electrification removal light source 111 passing through the substrate 104. It is also possible to employ such a constitution that the photocurable resin material is coated by spin coating, in which the mold 106 is moved instead of the substrate 104.

Figure 2:
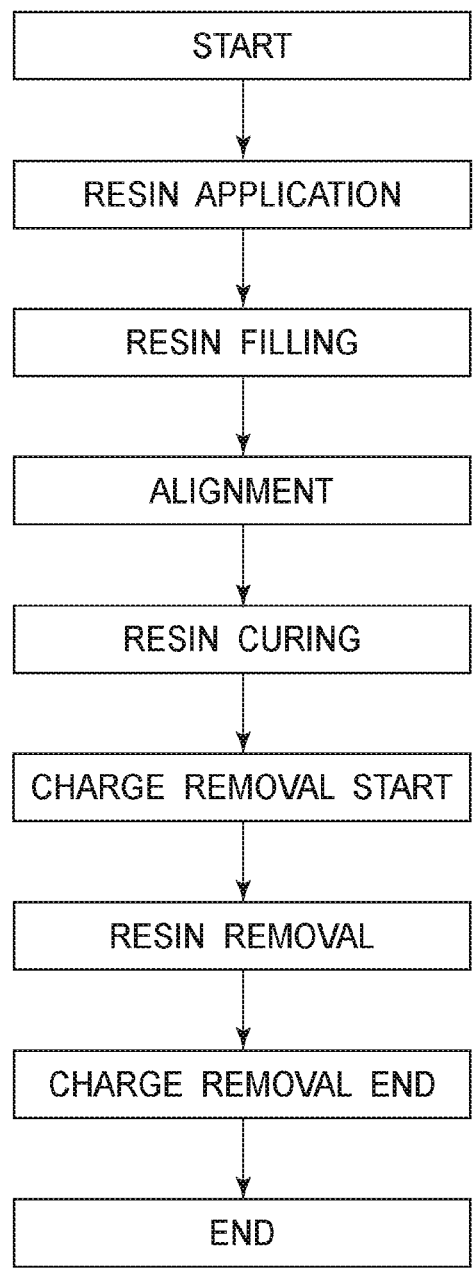
FIG. 2 is a flow chart for illustrating a pattern transfer step in an embodiment according to an imprint method of the present invention.

An imprint method in this embodiment will be described. FIG. 2 is a flow chart for illustrating a pattern transfer step in the imprint method in this embodiment.

First, onto the substrate 104, the photocurable resin material 105 is applied by the dispenser 113 to prepare a substrate having a resin material-coated surface.

Next, in a resin material filling step, the mold 106 and the substrate 104 are aligned with each other with a gap, between which the resin material is filled. At this time, a processing pressure is detected by the load cell 108.

In a subsequent alignment step, the substrate 104, onto which the photocurable resin material 105 is applied, is disposed opposite to the mold 106, to adjust a positional relationship therebetween by using the scope 109 and the stage 102.

The resin material filling step corresponds to a contact step for bringing a pattern forming surface (imprint pattern surface), of the mold, for transferring the pattern of the mold onto the resin material on the substrate.

Next, in a resin material curing step, the resin material between the substrate 104 and the mold 106 is irradiated with light from the photocuring light source 110 to be cured. Thereafter, the irradiation of light from the photocuring light source 110 is stopped.

In an electrification removal (electrical charge removal) start step, irradiation with light form the electrification removal light source 111 is performed to start the electrification removal from the mold 106, the photocurable resin material 105, and the substrate 104.

In a resin material parting (removal) step, the substrate 104 and the mold 106 are moved apart from each other while performing the electrification removal, to part (separate) the cured photocurable resin material 105 from the mold 106.

Finally, in an electrification removal end step, the electrification removal is completed by stopping the irradiation of light from the electrification removal light source 111.

The electrification removal start step, the resin material parting step, and the electrification removal end step correspond to a parting step, in the present invention, for parting the mold from the resin material, while performing electrification removal for removing electrification caused during a parting operation when the mold is parted from the resin material cured in the resin material curing step.

As described above, in the pattern transfer step in this embodiment, the electrification removal light source 111 continuously emits light from the start of the electrification removal to the end of the electrification removal.

Through the above-described steps, the imprint pattern at the surface of the mold 106 is transferred onto the resin material layer on the substrate 104.

In this embodiment, the parting is performed while effecting the electrification removal, so that it is possible to improve throughput.

Next, the electrification removal step will be described more specifically.

The wavelength of the light from the electrification removal light source 111 is selectable from a range of 200 nm or less, and may preferably be in a range of 100 nm or more, and 200 nm or less. Examples of the electrification removal light source 111 may include an argon excimer lamp (wavelength in a range with 126 nm as a center), an argon fluoride excimer lamp (wavelength in a range with 193 nm as a center), a xenon excimer lamp (wavelength in a range with 172 nm as a center), and a deuterium lamp.

By the irradiation light, gaseous molecules in an atmosphere are ionized, so that electrification is removed from the mold 106, the resin material 105, and the substrate 104 in the atmosphere.

The light irradiates the substrate with a wavelength that is liable to be absorbed by oxygen, so that the electrification removal may suitably be performed in an ionizable atmosphere, such as an atmosphere of inert gas, such as nitrogen, argon, or the like (low oxygen gas atmosphere), or a reduced-pressure atmosphere.

Therefore, it is preferable that the electrification removal is performed in a state in which the mold 106 and the substrate 104 are covered with a chamber, and the inside of the chamber is aerated with inert gas, such as nitrogen, helium, argon, or the like, or in a reduced-pressure state.

Further, it is also possible to employ such a constitution that the pattern surface of the mold 106 and the neighborhood thereof are placed in an atmosphere with a locally decreased oxygen concentration. For example, a nitrogen gas supplying mechanism is provided in the neighborhood of the pattern surface of the mold 106 and nitrogen gas is supplied therefrom during the electrification removal to create an atmosphere with a locally increased nitrogen concentration.

Further, after the contact of the mold with the substrate is performed in the reduced-pressure atmosphere, the electrification removal may be performed in the low oxygen gas atmosphere. Specifically, in the reduced-pressure state, the photocurable resin material 105 is filled in the gap between the mold 106 and the substrate 104. Thereafter, the electrification removal from the mold 106 and the photocurable resin material 105 can be performed while parting the photocurable resin material 105 from the mold 106 in an inert gas atmosphere created by supplying the inert gas, such as nitrogen. As a result, it is possible to compatibly realize prevention of bubble inclusion by placing the system in the reduced-pressure state during the filling, and improvement in electrification removal performance by supplying a high-concentration ionized gas during the parting.

The photocuring light source 110 is selectable from light sources with wavelengths capable of curing the photocurable resin material 105. When an ordinary photocurable resin material 105, curable by irradiation of light of about 365 nm, is used, a light source, such as the high-pressure mercury lamp, is usable.

In that case, the light from the photocurable light source 10 and the light from the electrification removal light source 111 can be configured and positioned to be introduced into the same optical path by using a half mirror to be emitted from the light irradiation mechanism 112.

The entire transfer pattern surface of the mold 106 is irradiated with the light from the light irradiation mechanism 112.

As described above, the light for the electrification removal is liable to be absorbed by oxygen, so that it is desirable that the optical path from the electrification removal light source 111 to the pattern surface of the mold 106 is placed in a reduced oxygen atmosphere, such as an atmosphere in which the inside of the chamber is aerated with nitrogen or argon, or is reduced in pressure.

As described above, by stopping the irradiation with the light from the photocuring light source 110 after the photocurable resin material 105 is cured, it is possible to alleviate a deterioration in transfer pattern accuracy caused by shrinkage of the photocurable resin material through a reaction after the parting.

The constitutions and arrangements of the photocurable resin material 110 and the electrification removal light source 111 are not limited to those in this embodiment, but are applicable to other constitutions. For example, it is possible to employ such a constitution that the light irradiation is performed from separate light irradiation mechanisms.

The photocurable light source and the electrification removal light source may also be constituted as the same light source with a wavelength for curing the photocurable resin material and a wavelength for performing the electrification removal. For example, by using the light source, such as the deuterium lamp having both of the wavelengths for the photocuring and the electrification removal, it is also possible to employ such a constitution that the curing of the photocurable resin material and the electrification removal are performed by the same light source.

Further, as the electromagnetic wave for ionizing the gaseous molecules, it is also possible to use X-rays having a wavelength of 0.1 nm or less. In this constitution, a mechanism for controlling shielding and irradiation range results in a large scale, so that it is difficult to use the light source and optical system for curing the resin material in common. However, by using X-rays having good light transmissivity, it is possible to effect imprinting in not only the less (no) oxygen atmosphere, but also, the ambient air, and to select various members as the mold 106.

In the imprint method and imprint apparatus in this embodiment, when the cured photocurable resin material 105 is parted from the mold 106, the transfer pattern surface is irradiated through the mold 106 with light having a wavelength of 200 nm or less. As a result, at the contact surface between the photocurable resin material 105 and the mold 106, the ionized gaseous molecules are supplied simultaneously with the parting, to remove the electrification from the mold 106, the photocurable resin material 105, and the substrate 104.

By the imprint method and imprint apparatus in this embodiment, it is possible to alleviate a degree of occurrence of a defect of the transfer pattern due to discharge breakdown or deposition of dust (contamination) during the parting between the mold 106 and the photocurable resin material 105.

In this embodiment, the photocurable resin material is used as the resin material, but other resin materials may also be usable. For example, in the case when heat processing is effected by using a thermoplastic resin material or a thermosetting resin material, it is possible to effect similar electrification removal, if the mold and the substrate are capable of transmitting therethrough light with a wavelength of 200 nm or less.

INDUSTRIAL APPLICABILITY

As described above, according to the present invention, when a mold (template) is separated from a member to be processed (work or resin material), it is possible to alleviate a degree of occurrence of a defect of a transfer pattern due to discharge breakdown of the transfer pattern and adsorption of dust (contamination) to the mold.

While the invention has been described with reference to the structures disclosed herein, it is not confined to the details set forth, and this application is intended to cover such modifications or changes as may come within the purpose of the improvements or the scope of the following claims.

The invention claimed is:

1. An imprint method comprising the steps of:
   providing a transparent mold having an imprint pattern at a side surface thereof facing a substrate;
   providing photocurable resin material on the substrate;
   patterning the photocurable resin by contacting the mold imprint pattern with the resin material;
   curing the patterned resin by irradiating curing light through the contacting mold;
   parting the mold from the cured resin; and
   removing any electrification from the mold, patterned resin, and substrate during said parting by irradiating an entire area in which the imprint pattern is formed with electrification removal light through the mold so as to ionize gaseous molecules in an atmosphere in which the mold, cured resin, and substrate are placed, the electrification removal light having a wavelength shorter than that of the curing light, and the electrification removal irradiation beginning while the mold and cured resin remain contacting and continuing throughout said parting.

2. The method according to claim 1, wherein the electrification removal light has a wavelength of 200 nm or less.

3. The method according to claim 1, wherein the electrification removal light has a wavelength of 100 nm or more and 200 nm or less.

4. The method according to claim 1, wherein the electrification removal light is X-ray light having a wavelength of 0.1 nm or less.

5. The method according to claim 1, wherein the curing light has a wavelength of about 365 nm.

6. The method according to claim 1, wherein the electrification removal is performed in a state in which a neighborhood of the mold is provided with a locally decreased oxygen concentration.

7. The method according to claim 1, further comprising supplying nitrogen gas to a neighborhood of the mold.

8. The method according to claim 1, wherein after said curing, a pressure in an atmosphere in which the mold and cured resin are placed is 0.1 Pa or more and 100 Pa or less.

9. The method according to claim 8, wherein the atmosphere is an inert gas atmosphere into which inert gas is supplied.

10. The method according to claim 1, wherein the electrification is removed by the ionized gaseous molecules.

11. The method according to claim 1, wherein the mold is formed of a transparent material capable of transmitting light having a wavelength of 200 nm or less.

12. The method according to claim 1, wherein the mold is formed of one of quartz, sapphire, fluorite, magnesium fluoride, and lithium fluoride.

13. The method according to claim 1, wherein the electrification removal irradiation begins before a distance between the substrate and mold is changed by said parting.

14. The method according to claim 1, wherein the electrification removal irradiation is conducted during movement of at least one of the substrate and the mold.

15. The method according to claim 1, wherein the electrification removal irradiation is conducted during said parting so as to ionize gaseous molecules located between the mold and cured resin.

16. The method according to claim 1, wherein the ionized gaseous molecules are supplied to a contact surface between the cured resin and mold simultaneously during said parting.

17. The method according to claim 1, wherein the curing light is irradiated from a first light source and the electrification removal light is irradiated from a second light source.

18. The method according to claim 1, wherein the curing light and the electrification removal light are irradiated from a single irradiation mechanism through a common optical path.

* * * * *